US012730446B2

(12) United States Patent
Lee et al.

(10) Patent No.: US 12,730,446 B2
(45) Date of Patent: Sep. 8, 2026

(54) TRANSFER ROBOT SYSTEM AND THE TRANSFER ROBOT SYSTEM DRIVING METHOD

(71) Applicant: SEMES CO., LTD., Cheonan-si (KR)

(72) Inventors: Seung Jun Lee, Hwaseong-si (KR); Seung Seok Ha, Seoul (KR); In Sung Choi, Hwaseong-si (KR); Gil Do Kim, Anseong-si (KR)

(73) Assignee: SEMES CO., LTD., Cheonan-si (KR)

(*) Notice: Subject to any disclaimer, the term of this patent is extended or adjusted under 35 U.S.C. 154(b) by 802 days.

(21) Appl. No.: 18/177,957

(22) Filed: Mar. 3, 2023

(65) Prior Publication Data

US 2024/0077878 A1 Mar. 7, 2024

(30) Foreign Application Priority Data

Sep. 6, 2022 (KR) ........................ 10-2022-0112919

(51) Int. Cl.
*G06F 7/00* (2006.01)
*B65G 1/137* (2006.01)
(Continued)

(52) U.S. Cl.
CPC ......... *G05D 1/0238* (2013.01); *B65G 1/1373* (2013.01); *H10P 72/3214* (2026.01); *H10P 72/3221* (2026.01)

(58) Field of Classification Search
CPC ...... G05D 1/0238; G05D 1/225; G05D 1/249; G05D 1/622; G05D 1/69; G05D 2105/28; G05D 2107/70; G05D 2109/10; G05D 2101/10; G05D 1/0231; G05D 1/0234; G05D 1/0236; G05D 1/024; G05D 1/0246; G05D 1/0251; G05D 1/628; G05D 1/639; G05D 1/644; G05D 1/693; G05D 1/698; B65G 1/1373; B65G 1/0457;
(Continued)

(56) References Cited

U.S. PATENT DOCUMENTS

2021/0249297 A1* 8/2021 Chu .................. H01L 21/67288

FOREIGN PATENT DOCUMENTS

JP 2020-111419 A 7/2020
KR 10-2010-0097630 A 9/2010

(Continued)

*Primary Examiner* — Yolanda R Cumbess
(74) *Attorney, Agent, or Firm* — Harness, Dickey. & Pierce, P.L.C

(57) ABSTRACT

The inventive concept provides a transfer robot system. Embodiments of the inventive concept provide a transfer robot system and a transfer robot system driving method in which a bottleneck phenomenon of mobile robots may be prevented, as a new obstacle which does not exist within a map for a mobile robot is recognized in advance during an autonomous driving of the mobile robot and the new obstacle is not passed through. The transfer robot system includes an OHT for transferring an article by autonomously driving along a rail and having a bottom side distance detection sensor installed for generating a distance information of below; and a mobile robot for transferring the article by autonomously driving on the ground and autonomously driving while avoiding an obstacle information generated through the distance information.

11 Claims, 4 Drawing Sheets

(51) Int. Cl.
*G05D 1/00* (2006.01)
*H10P 72/30* (2026.01)

(58) Field of Classification Search
CPC ............ B65G 1/0471; H01L 21/67724; H01L 21/67733; H01L 21/02; H01L 21/67727; H01L 21/6773; H01L 21/67736; H01L 21/67739; H01L 21/67748; H01L 21/67763; H01L 21/67766; G05B 19/41895; Y02P 90/02
USPC .................................................. 700/213, 218
See application file for complete search history.

(56) References Cited

FOREIGN PATENT DOCUMENTS

| | | | |
|---|---|---|---|
| KR | 101980277 | B1 | 5/2019 |
| KR | 10-2021-0056694 | A | 5/2021 |
| KR | 10-2022-0028841 | A | 3/2022 |
| KR | 10-2022-0039173 | A | 3/2022 |
| KR | 10-2022-0045778 | A | 4/2022 |

* cited by examiner

TRANSFER ROBOT SYSTEM AND THE TRANSFER ROBOT SYSTEM DRIVING METHOD

CROSS-REFERENCE TO RELATED APPLICATIONS

A claim for priority under 35 U.S.C. § 119 is made to Korean Patent Application No. 10-2022-0112919 filed on Sep. 6, 2022, in the Korean Intellectual Property Office, the entire contents of which are hereby incorporated by reference.

BACKGROUND

Embodiments of the inventive concept described herein relate to a transfer robot system and a transfer robot system driving method, more specifically, a transfer robot system and a transfer robot system driving method so a new obstacle is not passed through during an autonomous driving, if the new obstacle does not exist on a map during the autonomous driving of a mobile robot.

A semiconductor manufacturing technology is responding to a rapidly changing technology innovation speed and a rapidly changing environment as technology-intensive future technologies are fused. Also, especially as semiconductor elements are integrated and high-performance products are developed, an article technology of a semiconductor manufacturing process is opting for more efficient technology.

This semiconductor manufacturing article flow is managed according to a field situation through resolving a bottleneck phenomenon, improving a facility failure, through preventive maintenance (PM), or the like.

In accordance with this semiconductor manufacturing article flow, a semiconductor fab (FAB) performs various article transfers using an Overhead Hoist Transport (OHT).

These OHTs are operated in large quantities on a rail, and in order to control and manage them, there is an OHT control system (OHT Control System) which controls and manages an entirety of OHTs.

In addition to the aforementioned OHT, the semiconductor manufacturing article technology has a mobile robot control system which drives mobile robots such as autonomous mobile robots (AMRs) and automated guided vehicles (AGVs).

In this case, conventional mobile robots autonomously drive to a set destination, mainly using an autonomous driving technology called SLAM, which is a simultaneous position tracking and map creation algorithm. In this case, the mobile robot autonomously moves to the set destination while avoiding obstacles existing on a path using a lidar sensor which detects a distance if an obstacle is in close proximity.

Here, conventional mobile robots autonomously drive based on a pre-explored map when moving to the set destination. The pre-explored map includes the obstacle information such as manufacturing facilities or walls, so that a pre-input obstacle information is excluded from the autonomous driving path, the lidar sensor's distance detection function allows an autonomous driving while avoiding a collision.

In this case, if new obstacles such as a test of new facilities or a temporary fixed obstacle are placed among the obstacles, since the conventional mobile robot drives depending only on a distance information by the lidar sensor without a new obstacle information on the map of the new obstacle, the new obstacle is recognized as a driving path which can be passed through the lidar sensor detects the new obstacle.

In this way, if mobile robots which recognize new obstacles as driving paths are adjacent to a new obstacle which is an unavoidably large object or a region which cannot be driven, the mobile robots continue to attempt to pass through the new obstacles. At this time, if other mobile robots enter a vicinity of the new obstacle, mobile robots near the new obstacle continue to attempt to pass the new obstacle, causing a bottleneck phenomenon in which mobile robots cannot move and gather near the new obstacle.

PRIOR ART

Patent Literature

Korean Patent Application Publication No. 10-2022-0028841 (Published on Mar. 8, 2022)

SUMMARY

Embodiments of the inventive concept provide a transfer robot system and a transfer robot system driving method for preventing a bottleneck phenomenon of mobile robots from occurring at a new obstacle position, by excluding a new obstacle which does not exist within a map in advance from an autonomous driving path, during a moving of a mobile robot.

The technical objectives of the inventive concept are not limited to the above-mentioned ones, and the other unmentioned technical objects will become apparent to those skilled in the art from the following description.

The inventive concept provides a transfer robot system. The transfer robot system includes an OHT for transferring an article by autonomously driving along a rail and having a bottom side distance detection sensor installed for generating a distance information of below; and a mobile robot for transferring the article by autonomously driving on the ground and autonomously driving while avoiding an obstacle information generated through the distance information.

In an embodiment, the OHT is configured of a plurality of OHTs operated along the rail, and each of the plurality generate a distance information of below.

In an embodiment, the OHT generates an obstacle information in cases in which the distance information detected by the bottom side distance detection sensor is closer than a factory ground distance information.

In an embodiment, the OHT autonomously drives in a top space, and the mobile robot autonomously drives in a bottom space of the OHT, and the OHT and the mobile robot autonomously drive in a state in which a driving path do not overlap with each other.

In an embodiment, a position information is further generated at the obstacle information.

In an embodiment, the position information is a node information of the OHT.

In an embodiment, the transfer robot system further includes an OHT control system for setting a driving path information of the OHTs by performing a communication with the OHTs, monitoring a driving information and a state information of the OHT and an article information, and forming the obstacle information with the distance information detected by the bottom side distance detection sensors of each of the OHTs.

In an embodiment, the OHT control system updates the obstacle information in real time according to a preset cycle.

In an embodiment, the transfer robot system further includes a mobile robot control system for sending a map information for a mobile robot to the mobile robot by performing a communication with the mobile robot, managing a driving schedule of the mobile robot by setting a departure point and a destination for the mobile robot, performing a communication with the OHT control system, and receiving the obstacle information from the OHT control system to transfer to the mobile robot.

In an embodiment, the mobile robot autonomously drives on a path that does not include the obstacle information.

In an embodiment, the mobile robot further includes a proximity sensor for the mobile robot for generating an impact alert information by detecting an obstacle existing on an autonomous driving path. and the mobile robot corrects a driving path of until a set distance to avoid the obstacle if the impact alert information is generated and autonomously drives.

The inventive concept provides a transfer robot system driving method. The transfer robot system driving method includes searching for an obstacle by a bottom side distance detection sensor installed each of all of OHTs which are moving on a rail to detect a distance information of below; generating an obstacle information by the OHT control system performing a communication with each of the OHTs to be input with the distance information detected by each of the OHTs, and forming the obstacle information according to the distance information which is input; transferring the obstacle information generated by the OHT control system to a mobile robot control system by connecting the OHT control system and the mobile robot control system by performing a communication; and sharing the obstacle information by performing a communication of the mobile robot control system and a mobile robot so the obstacle information is transferred and shared to each mobile robot.

In an embodiment, at the searching for the obstacle, cases in which the distance information detected from the bottom side distance sensor of the OHT is closer than a distance information of a factory ground is generated as the obstacle information.

In an embodiment, a position information is further generated in the obstacle information.

In an embodiment, the position information is a node information of the OHT.

In an embodiment, the transfer robot system driving method further includes autonomous driving of the mobile robot in which the mobile robots determine an autonomous driving according to an autonomous driving algorithm at a driving path excluding from the obstacle information.

In an embodiment, the OHT autonomously drives at a top space at the searching for the obstacle, and the mobile robot autonomously drives at a bottom space of the OHT while a driving path of the OHT and the mobile robot do not overlap with each other at the autonomous driving of the mobile robot.

In an embodiment, the OHT control system updates the obstacle information in real time according to a preset cycle.

In an embodiment, the mobile robot control system sends a map information for the mobile robot to the mobile robot by performing a communication with the mobile robot, and manages a driving schedule of the mobile robot by setting a departure point and a destination for the mobile robot.

The inventive concept provides a transfer robot system driving method. The transfer robot system driving method includes searching for an obstacle by a bottom side distance detection sensor installed each of all of OHTs which are moving on a rail to detect a distance information of below; generating an obstacle information by the OHT control system performing a communication with each of the OHTs to be input with the distance information detected by each of the OHTs, and forming the obstacle information according to the distance information which is input; transferring the obstacle information generated by the OHT control system to a mobile robot control system by connecting the OHT control system and the mobile robot control system by performing a communication; sharing the obstacle information by performing a communication of the mobile robot control system and a mobile robot so the obstacle information is transferred and shared to each mobile robot; and autonomous driving of the mobile robot in which the mobile robots determine an autonomous driving according to an autonomous driving algorithm at a driving path excluding from the obstacle information, and wherein at the searching for the obstacle, cases in which the distance information detected from the bottom side distance sensor of the OHT is closer than a distance information of a factory ground is generated as the obstacle information, and in the obstacle information a position information which is a node information of the OHT is further generated, and the OHT autonomously drives at a top space at the searching for the obstacle, and the mobile robot autonomously drives at a bottom space of the OHT while a driving path of the OHT and the mobile robot do not overlap with each other at the autonomous driving of the mobile robot.

According to an embodiment of the inventive concept, a bottleneck phenomenon of mobile robots may be prevented, as a new obstacle which does not exist within a map for a mobile robot is recognized in advance during an autonomous driving of the mobile robot and the new obstacle is not passed through.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
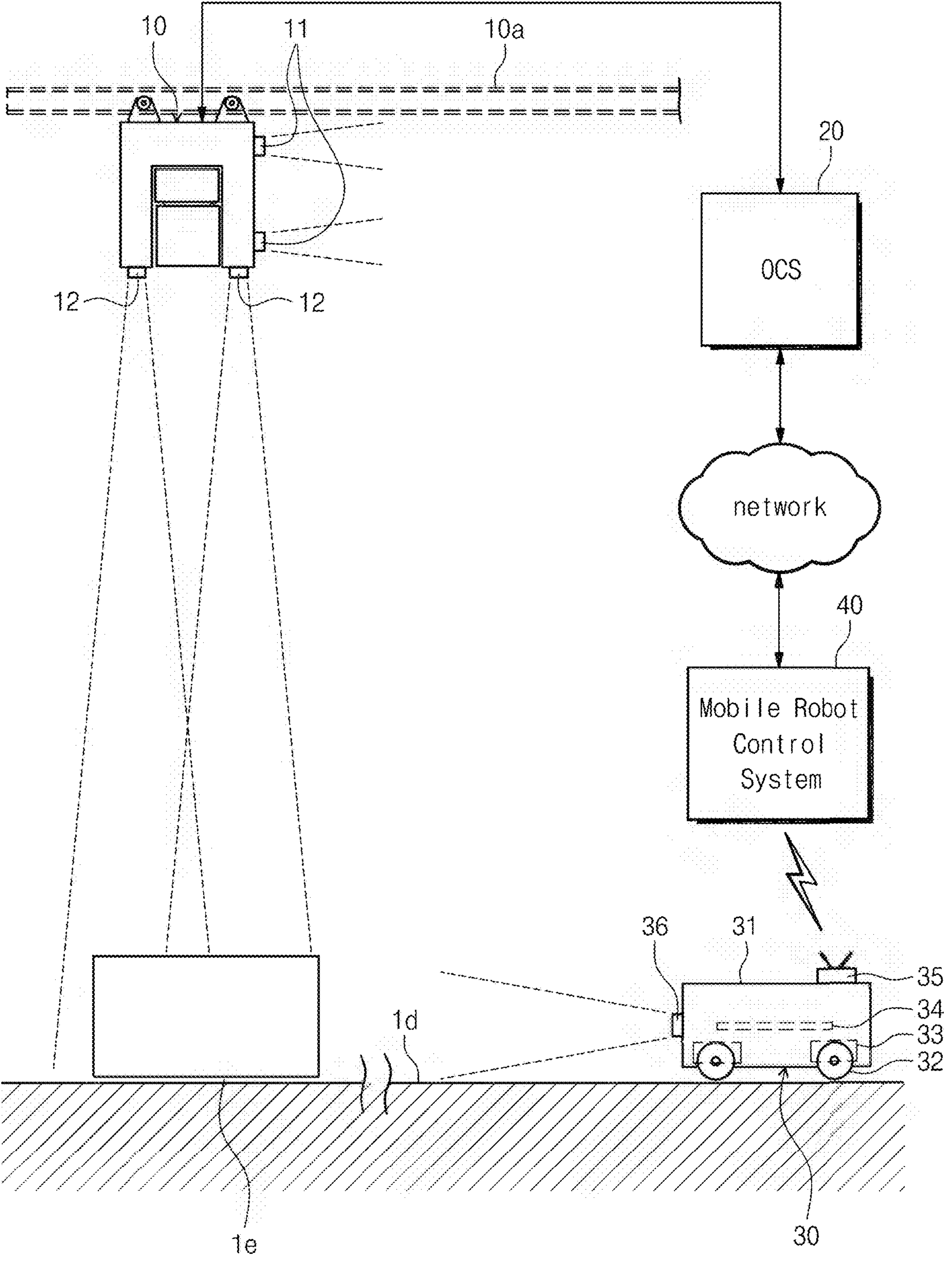
FIG. 1 is a block view of a transfer robot system viewed from a side according to an embodiment of the inventive concept.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
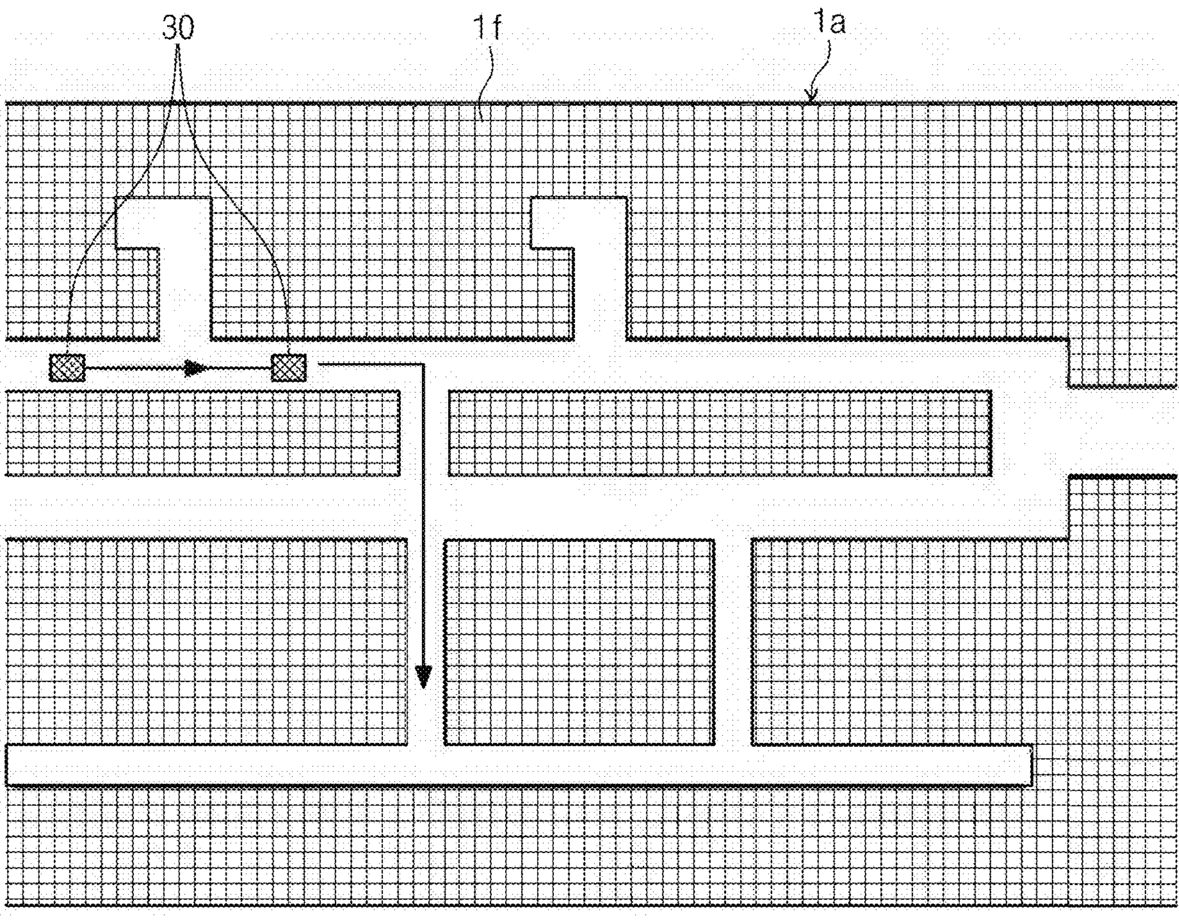
FIG. 2 is a block view of a mobile robot shown in FIG. 1 in a state before a map for the mobile robot is updated.
Figure 3:
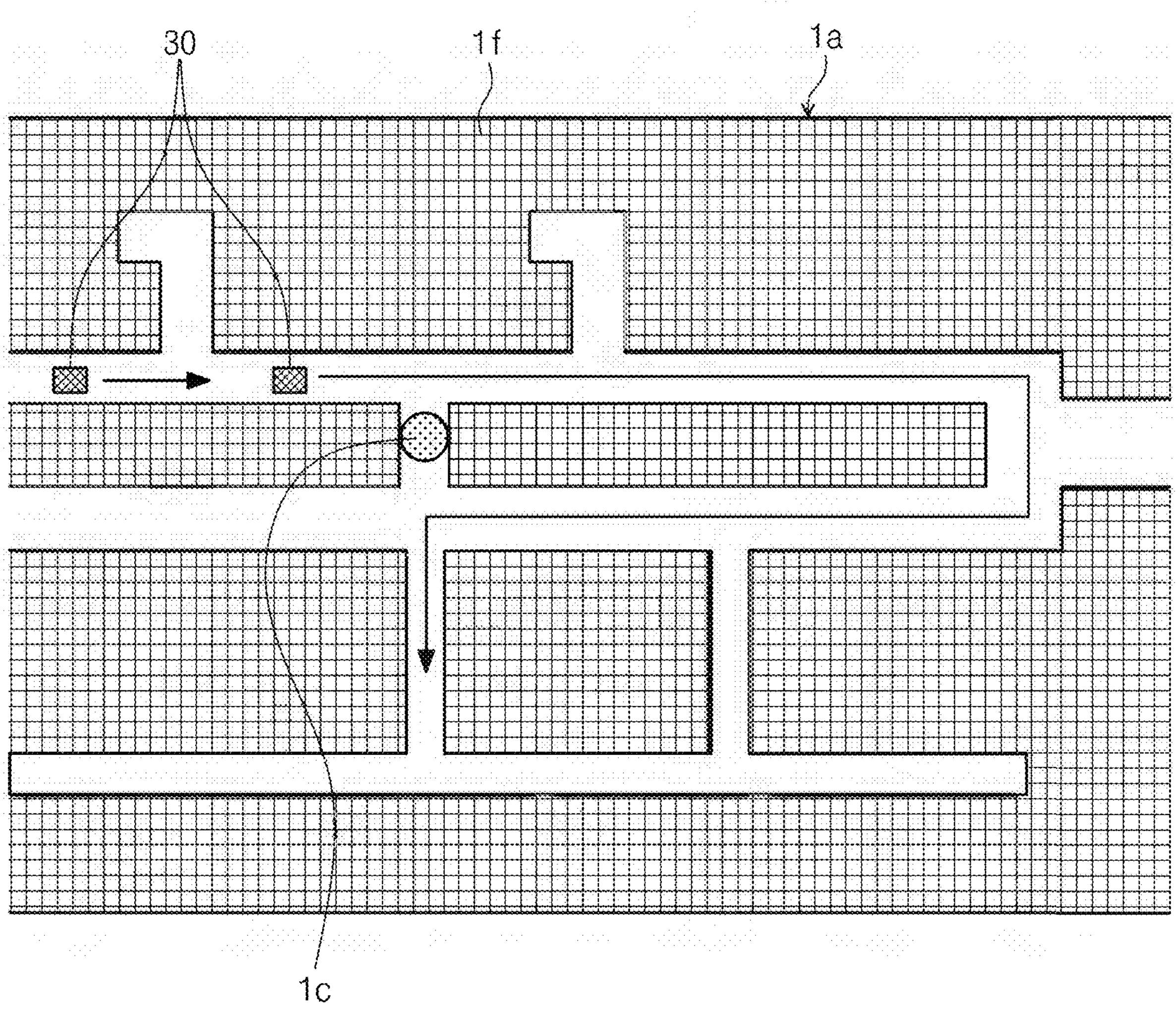
FIG. 3 is a block view of a new obstacle map in which an obstacle information is updated in the map for the mobile robot of the mobile robot shown in FIG. 2.

FIG. 1 is a block view of a transfer robot system viewed from a side according to an embodiment of the inventive concept. FIG. 2 is a block view of a mobile robot shown in FIG. 1 in which an obstacle information is not formed on a map for the mobile robot. FIG. 3 is a block view in which the obstacle information is formed on the map for the mobile robot of the mobile robot shown in FIG. 2.

As illustrated in FIG. 1, the transfer robot system according to an embodiment of the inventive concept includes an OHT 10, an OHT control system 20, a mobile robot 30, and a mobile robot control system 40.

The OHTs 10 automatically transfer a FOUP (Front Open Unified Pod), which is a sealed wafer container for storing and transferring wafers, while autonomously driving along a rail 10*a* installed in a top space of a semiconductor manufacturing facility based on a pre-stored map. In this case, the OHTs 10 connects with the OHT control system 20 to be input with an article scheduling information of, for example, a departure point information and a destination information, and an information of a cargo to be loaded, and automatically transfers the article along the rail according to the article scheduling information.

In this case, the rail 10*a* of a path operated by the OHT 10 is installed in the top space which is upwardly spaced apart from the ground 1*d*. Accordingly, the OHT 10 can form an obstacle information 1*c* to be described later by autonomously driving without overlapping the driving path with the mobile robot 30.

In addition, the OHT 10 autonomously drives on a path formed on a map for the OHT (not shown) based on the map for the OHT, and in this case, the OHT 10 is equipped with a front proximity sensor for the OHT 11 which detects obstacles in a driving direction by a distance detection, and the front proximity sensor for the OHT 11 may be selected from distance sensors such as a radar sensor, a light displacement sensor, and an ultrasonic sensor. This front proximity sensor for the OHT prevents collisions by detecting other obstacles on the path along the rail during an automatic driving of the OHT 10 and autonomously drives on a new path.

In addition, the OHT 10 is equipped with a bottom side distance detection sensor 12. Unlike the front proximity sensor for the OHT 11 which prevents collisions with obstacles along the rail, the bottom side distance detection sensor 12 is not used to prevent collisions when the OHT 10 is driven, but is used to detect new ground obstacles 1*e* in a bottom lower space of the path on which the OHT 10 moves. Here, the OHT 10 transmits a bottom distance information map collected through the bottom side distance detection sensor 12 to the OHT control system 20 through at least one communication means selected among a wireless LAN (Wifi), a short-range mesh network (N:N, Ad-hoc), a Bluetooth, a Zigbee, an IrDA, and a long-distance communication. If the OHT 10 detects a ground obstacle 1*e* in a space below by the bottom side distance detection sensor 12, it is possible to detect a newly installed ground obstacle 1*e* in all regions at which the rail 10*a* is installed.

In addition, the OHT 10 has a distance information from the bottom side distance detection sensor 12 to a factory ground 1*d* of the semiconductor manufacturing facility, and if a distance information detected by detecting the ground obstacle 1*e* is closer than a distance information of the factory ground, a new obstacle information 1*c* is generated and the newly generated obstacle information 1*c* along with a node information, which is a OHT 10 position information at a generation time point is transmitted to the OHT control system 20.

The OHT control system 20 (OSC: OHT control system) performs a short-range communication or a long-distance communication with the OHTs 10 which are aforementioned, sets a driving path information on for a path carrying the FOUP, and monitors a driving status of the OHTs 10. In addition, the OHT control system 20 monitors a status information of the OHTs 10, a cargo load/unload information of the OHTs 10, and a cargo tag information, etc.

In addition, the OHT control system 20 receives the obstacle information collected by the bottom side distance detection sensor 12 of each of the OHTs 10 from the OHTs, generates the obstacle information 1*c* based on the node information, and transmits a generated obstacle information 1*c* to a mobile robot control system 40. In this case, the obstacle information 1*c* is displayed as a position information identified among a position information of an entire region of below the rail at which the OHT 10 is driving, and includes the distance information collected by the bottom side distance detection sensor 12. Here, since the obstacle information 1*c* contains a vertical distance information from each position information to the factory ground, it is possible to distinguish whether coordinates corresponding to each position are a distance information to the factory ground 1*d* of the semiconductor manufacturing facility or a facility distance information, or the like. In this case, the OHT control system 20 generates and records an obstacle information 1*c* for which the mobile robot 30 cannot drive if a distance value is detected which is different from a position information to the factory floor 1*d*. For example, if a height distance value from the bottom side distance detection sensor 12 to the factory ground 1*d* is 10 m, and a distance information 1*c* detected by the bottom side distance detection sensor 12 is within a certain error value from 10 m, the obstacle information 1*c* may not be generated, and in a case in which a distance information 1*c* detected by the bottom side distance detection sensor 12 is outside the certain error value from 10 m, the obstacle information 1*c* may be generated.

The mobile robot 30 is an autonomous driving apparatus such as an autonomous mobile robot (AMR) and an automated guided vehicle (AGV) which automatically transfers the article within a semiconductor manufacturing facility.

In this embodiment, the mobile robot 30 includes a main body unit 31, a wheel 32, a mobile robot driving unit 33, a mobile robot control unit 34, a mobile robot communication unit 35, and a proximity sensor for the mobile robot 36.

The main body unit 31 is formed of a structure in various forms to provide a region to which the mobile robot driving unit 33 and the mobile robot control unit 34 are coupled and to transfer and load the article within the semiconductor manufacturing facility.

The wheel 32 is coupled to a motor shaft of the mobile robot driving unit 33 coupled to the main body unit 31, and moves the main body unit 31 when the driving motor (not shown) moves in contact with the ground 1*d* in the semiconductor manufacturing facility factory.

The mobile robot driving unit 33 includes a motor (not shown) and a motor driving circuit (not shown), and receives a control command according to an autonomous driving command of the mobile robot control unit 34 to drive the wheel 32 which is connected to the motor, thereby driving the main body unit 31 through an autonomous driving path.

The mobile robot control unit 34 is a control apparatus which controls the mobile robot driving unit 33 according to a command of a preset program, and controls the mobile robot control unit 33 to store a map for the mobile robot 1*a* which is pre-surveyed and generated by the proximity sensor 36, and avoid the pre-surveyed obstacle information if of the map for the mobile robot 1*a* but to autonomous drive on an autonomous driving algorithm to the set destination. In addition, the mobile robot control unit 34 communicates with the mobile robot control system 40 to receive a departure point information and a destination information, and an article information, and transmits a command to the mobile robot driving unit 33 to transfer the article while autonomously driving based on the departure point information and the destination information, and the article information which is input. Meanwhile, as shown in FIG. 2 and FIG. 3, the map for mobile robot 1*a* can be output in a grid coordinate form using pixel values as a position information. In this case, if it corresponds to the factory ground 1*d*, it is displayed as an empty space which is a drivable region, and an un-drivable region which is a pre-surveyed.

Obstacle information if is displayed as a pixel value of a different color. In addition, grid coordinates shown in FIG. 2 and FIG. 3 clearly distinguish boundary shapes of the pixels for convenience of explanation, but the actual grid coordinates may not be clearly distinguished due to a noise or a reduction of a reflexibility of a proximity sensor for the mobile robot 36.

The mobile robot communication unit 35 is an apparatus which communicates with the mobile robot control system 40, and uses a short-range communication such as a wireless LAN (Wifi), a short-range mesh network (N:N, Ad-hoc), a Bluetooth, a Zigbee, and an IrDA, or if necessary, a long-distance communication. Like this, the mobile robot communication unit 35 sends/receives a departure point information, a destination information, and an article information to/from the mobile robot control system 40 and transmits to the mobile robot control unit 34, and transmits a position information and various status information of the mobile robot control unit 34 to the mobile robot control system 40.

The proximity sensor for the mobile robot 36 is a sensor which detects obstacles existing in the autonomous driving path through a distance detection, and consists of a laser distance detection sensor such as a lidar sensor, and may be an ultrasonic displacement sensor or a light displacement sensor if necessary. Here, if detecting an obstacle, the proximity sensor for the mobile robot 36 transmits a collision alert information to the mobile robot control unit 34, and the mobile robot control unit 34 which has received the collision alert information modifies the driving path to a destination set to avoid the obstacle and drives autonomously. The proximity sensor for the mobile robot 36 is an essential sensor to recognize obstacles adjacent to a front of the driving path, and is driven separately from the bottom side distance detection sensor 12 to generate the obstacle information 1*c*.

The mobile robot control system 40 communicates with mobile robots 30 operating in the semiconductor manufacturing facilities to set or monitor the departure point information, the destination information, and the position information, or the like of mobile robots 30 to manage a driving schedule of the mobile robot 30.

In addition, the mobile robot control system 40 receives article contents and a load/unload information of the article when mobile robots 30 transfer the article in semiconductor manufacturing facility to monitor article contents and article moving details. In addition, the mobile robot control system 40 connects with the mobile robots 30 to monitor all driving conditions of the mobile robots 30 and receives and monitors a state information on a battery status, a power status, and an overload status of the mobile robots 30.

In addition, the mobile robot control system 40 performs a wired/wireless communication with the OHT control system 20, and receives the obstacle information 1*c* from the OHT control system 20. In this case, the mobile robot control system 40 having received the obstacle information 1*c* transmits the obstacle information 1*c* to all mobile robots 30, and the mobile robots 30 having received the obstacle information 1*c* drive autonomously on a path which does not include the obstacle information 1*c*. Therefore, since the mobile robot 30 can receive obstacle information from the mobile robot control system 40 that is not detected by the proximity sensor for the mobile robot 36, a bottleneck phenomenon between mobile robots 30 encountering a new obstacle position is prevented.

Figure 4:
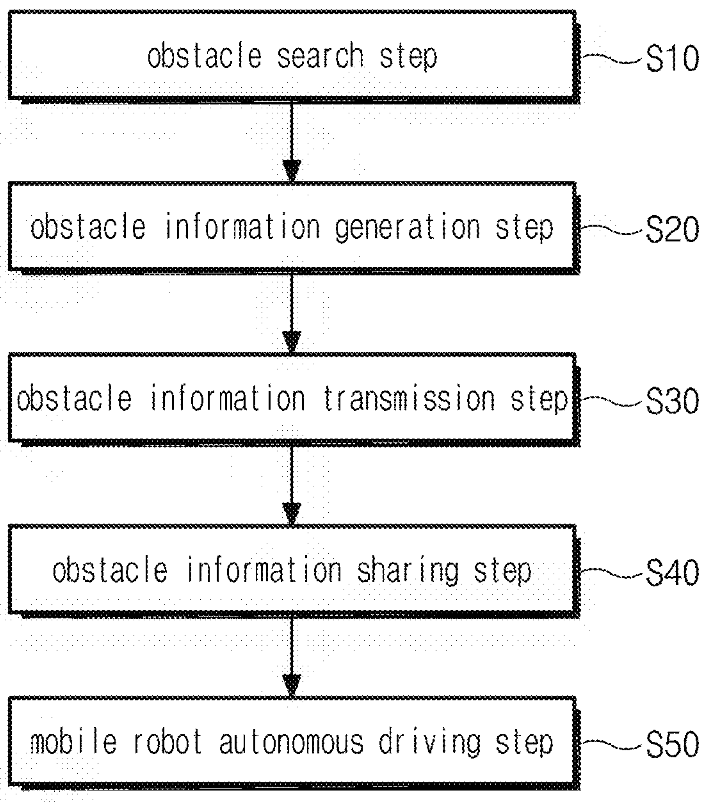
FIG. 4 is a flowchart of a transfer robot system driving method according to an embodiment of the inventive concept.

FIG. 4 is a flowchart of a transfer robot system driving method according to an embodiment of the inventive concept.

Hereinafter, the transfer robot system driving method according to an embodiment of the inventive concept will be described.

First, the transfer robot system driving method according to an embodiment of the inventive concept includes an obstacle search step S10, an obstacle information generation step S20, an obstacle information transmission step S30, an obstacle information sharing step S40, and a mobile robot autonomous driving step S50.

In the obstacle search step S10, the bottom side distance detection sensor 12 installed in each of all the OHTs 10 moving along the rail 10*a* searches the obstacle 1*e* to detect a distance information of below. In this case, in the obstacle search step S10, a node information which is the position information of the OHT 10 is detected together with the distance information.

Next, in the obstacle information generation step S20, the OHT control system 20 performs the aforementioned communication with each of the OHTs 10 to receive the distance information detected by each of the OHTs 10, and forms the obstacle information 1*c* through the received distance information. In this case, as described above, the OHT control system 20 generates the obstacle information 1*c* if the distance information generated by each of the OHTs 10 is different from the distance information from the factory ground 1*d*. The obstacle information 1*c* generated by such an obstacle information generation step S20 is generated in real time according to a preset cycle throughout an entire region at which the OHTs 10 move and the rails are installed.

Next, in the obstacle information transmission step S30, the OHT control system 20 and the mobile robot control system 40 perform a communication to communicate, and the obstacle information 1*c* generated by the OHT control system 20 is transmitted to the mobile robot control system 40.

Next, in the obstacle information sharing step S40, the mobile robot control system 40 and the mobile robot 30 communicate and transmit the obstacle information 1*c* transmitted by the mobile robot control system 40 to each of the mobile robots 30 for a communication.

Next, in the mobile robot autonomous driving step S50, the mobile robots 30 determine an autonomous driving according to an autonomous driving algorithm in the driving path except for the new obstacle information 1*c* as well as a pre-surveyed obstacle information if within the map for the mobile robot 1*a*.

In this way, the transfer robot system and the transfer robot system driving method according to an embodiment of the inventive concept prevents a bottleneck phenomenon of the mobile robots 30 by recognizing new obstacles which are not present in the map for the mobile robot 30 in advance so new obstacles are not passed through.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A transfer robot system comprising:

an overhead hoist transport (OHT) for transferring an article by autonomously driving along a rail and having a bottom side distance detection sensor installed for generating a distance information below the OHT; and a mobile robot for transferring the article by autonomously driving on the ground and autonomously driving while avoiding an obstacle indicated by obstacle information generated based on the distance information.

2. The transfer robot system of claim 1, wherein the OHT is one of a plurality of OHTs operated along the rail, and the bottom side distance detection sensor on each of the plurality of OHTs generates the distance information below each of the plurality of OHTs.

3. The transfer robot system of claim 1, wherein the OHT generates the obstacle information as a result of the distance information detected by the bottom side distance detection sensor being closer than a distance indicated by factory ground distance information.

4. The transfer robot system of claim 1, wherein the OHT autonomously drives in a top space, and the mobile robot autonomously drives in a bottom space of the OHT, and the OHT and the mobile robot autonomously drive in a state in which a driving path of the OHT does not overlap with a driving path of the mobile robot.

5. The transfer robot system of claim 1, wherein the obstacle information includes obstacle position information.

6. The transfer robot system of claim 5, wherein the obstacle position information is node information of the OHT.

7. The transfer robot system of claim 1, further comprising an OHT control system for setting driving path information of the OHTs by performing a communication with the OHTs, monitoring driving and state information of the OHT and an article, and generating the obstacle information based on the distance information detected by the bottom side distance detection sensors of each of the OHTs.

8. The transfer robot system of claim 7, wherein the OHT control system updates the obstacle information in real time according to a preset cycle.

9. The transfer robot system of claim 7, further comprising a mobile robot control system for sending a map for a mobile robot to the mobile robot by communicating with the mobile robot, managing a driving schedule of the mobile robot by setting a departure point and a destination for the mobile robot, performing a communication with the OHT control system, and receiving the obstacle information from the OHT control system to transfer to the mobile robot.

10. The transfer robot system of claim 9, wherein the mobile robot autonomously drives on a path that does not include the obstacle indicated by the obstacle information.

11. The transfer robot system of claim 9, wherein the mobile robot further includes a proximity sensor configured to generate impact alert information by detecting an obstacle on an autonomous driving path, and the mobile robot corrects a driving path of the OHT by a set distance to avoid the obstacle in response to the impact alert information being generated.

* * * * *